United States Patent [19]

Itaya et al.

[11] Patent Number: 5,721,751
[45] Date of Patent: Feb. 24, 1998

[54] SEMICONDUCTOR LASER

[75] Inventors: Yoshio Itaya, Kawasaki; Shinichi Matsumoto, Isehara, both of Japan

[73] Assignee: Nippon Telegraph & Telephone Corporation, Tokyo, Japan

[21] Appl. No.: 796,506

[22] Filed: Feb. 6, 1997

Related U.S. Application Data

[63] Continuation of Ser. No. 329,335, Oct. 26, 1994, abandoned.

[30] Foreign Application Priority Data

Oct. 28, 1993 [JP] Japan ................. 5-270693

[51] Int. Cl.$^6$ ................................................. H01S 3/19
[52] U.S. Cl. ........................ 372/46; 372/45; 257/748
[58] Field of Search ........................... 372/46, 45, 43, 372/44; 257/748, 745

[56] References Cited

U.S. PATENT DOCUMENTS

| | | | |
|---|---|---|---|
| 4,868,838 | 9/1989 | Yamamoto | 372/46 |
| 4,870,649 | 9/1989 | Bobeck et al. | 372/46 |
| 4,935,936 | 6/1990 | Nelson et al. | 372/46 |
| 4,949,349 | 8/1990 | Ohba et al. | 372/46 |

FOREIGN PATENT DOCUMENTS

| | | |
|---|---|---|
| 60-20593 | 2/1985 | Japan . |
| 60-224288 | 11/1985 | Japan . |
| 63-25991 | 2/1988 | Japan . |
| 63-150982 | 6/1988 | Japan . |
| 1-189185 | 7/1989 | Japan . |

OTHER PUBLICATIONS

Agrawal and Dutta, Semiconductor Lasers, Van Nostrand Reinhold, New York, pp. 201–202, 1993.

"Metalorganic chemical vapor deposition of InGaAsP/InP layers and fabrication of 1.3–μm planar buried heterostructure lasers", T. Kawabata et al; J. Appl. Phys. 64(7), pp. 3684–3688, Oct. 1, 1988.

"Low Threshold Operation of 1.5 μm Buried–Heterostructure DBF Lasers Grown Entirely By Low–Pressure MOVPE", Electronics Letters, Feb. 26, 1987, vol. 23 No. 5, pp. 193–194.

"MOVPE Regrowth of Semi–Insulating InP Around Reactive Ion Laser Mesas", Electronics Letters, May 23, 1991, vol. 27 No. 11, pp. 926–927.

"25 GHz Bandwidth 1.55 μm GainAsP p–Doped Strained Multiquantum–Well Lasers", P.A. Morton, et al; Electronics Letters, Nov. 5, 1992, vol. 28 No. 23, pp. 2156–2157.

*Primary Examiner*—Rodney B. Bovernick
*Assistant Examiner*—Yisun Song
*Attorney, Agent, or Firm*—Frishauf, Holtz, Goodman, Langer & Chick, P.C.

[57] ABSTRACT

A semiconductor laser includes (a) a semiconductor substrate of a first conductivity type on which is provided (b) a mesa stripe portion having a multilayer structure. The multilayer structure includes (b-1) an active layer provided on the semiconductor substrate. The laser also includes (c) a buried current blocking layer arranged on both sides of the mesa stripe portion, (d) a clad layer of a second conductivity type provided on the semiconductor substrate through at least a portion of the active layer, and (e) a contact layer of the second conductivity type provided on the clad layer. The contact layer includes a first contact layer contacting the clad layer and a second contact layer provided on the first contact layer. The first contact layer has an energy gap smaller than that of the clad layer and larger than that of the second contact layer. Preferably, the first contact layer is an InGaAsP semiconductor layer having an energy gap within the range of from 0.82 eV to 1.12 eV, the second contact layer is selected from the group consisting of an InGaAs semiconductor layer and an InGaAsP semiconductor layer which has an energy gap of 0.8 eV, and the clad layer contacting the first contact layer is an InP layer.

14 Claims, 15 Drawing Sheets

SEMICONDUCTOR LASER

This is a Continuation of application Ser. No. 08/329,335, filed Oct. 26, 1994, now abandoned.

BACKGROUND OF THE INVENTION

1. Field of the Invention

The present invention relates to a semiconductor laser and more particularly to a buried heterostructure semiconductor laser which is useful as a light source for optical communication.

2. Description of the Related Art

A buried heterostructure laser, which confines current and light in a narrow active layer effectively and, hence, can operate at a low current, has been used as a highly efficient light source in optical communication. The buried heterostructure laser includes two different types of structure depending on the type of embedded layers provided on the both sides of mesa stripes. One is a p-n junction buried heterostructure laser diode and the other is a high resistive buried heterostructure laser diode. First, explanation will be made on a conventional p-n buried heterostructure laser diode. FIG. 1 is a cross-sectional perspective view showing a conventional buried heterostructure laser diode grown entirely by a metal organic vapor phase epitaxy (cf. Japanese Patent Application Laying-open No. 189185/1988; and Itaya, Oishi, Nakao, Sato, Kondo and Imamura, "Low-threshold operation of 1.5 μm buried heterostructure DFB lasers grown entirely by low pressure MOVPE", Electron. Lett., pp. 193–194, vol. 23, 1987). The buried heterostructure laser is featured by a low mesa stripe as high as not higher than 1 μm. This is intended to prevent a mask overgrowth of the side wall of mesa which tends to occur in MOVPE and fabricate a buried heterostructure laser. For its fabrication, an n-InP substrate 1 doped with Sn and having an n-type carrier concentration of $2\times10^{18}$ cm$^{-3}$ is provided, on which there are sequentially grown an n-InP buffer layer 2 having an n-type carrier concentration of $2\times10^{18}$ and a thickness of 0.5 μm, an undoped InGaAsP active layer 3 having a bandgap wavelength of 1.55 μm and a thickness of 0.1 μm, and a p-InP layer 4 doped with Zn as a p-dopant and having a thickness of 0.5 μm. On a surface of the product, there is formed an SiO$_2$ film by sputtering. A stripe mask of 1.5 to 2.0 μm wide is fabricated by a common photolisography and a common dry etching technique. Then, a mesa stripe is formed by a conventional reactive dry etching technique using chlorine or a chlorine-containing gas down to below the active layer. Thereafter, the side wall of the mesa stripe is buried with a p-InP layer 5 having a p-carrier concentration of $10^{17}$ cm$^{-3}$ and a thickness of 0.7 μm and an n-InP layer 6 having an n-carrier concentration of $10^{17}$ cm$^{-3}$ and a thickness of 0.7 μm. The SiO$_2$ mask is removed with hydrofluoric acid. A p-InP clad layer 7 having a p-carrier concentration of $10^{17}$ cm$^{-3}$ and a thickness of 1.5 μm and a p+-InGaAs layer 8 having a thickness of 0.5 μm, serving as a contact layer, are grown sequentially on overall the surface of the resulting structure. On the contact layer 8, there are provided a current restricting SiO$_2$ layer 9 and a p-electrode 10 consisting of AuZnNi. On the bottom surface of the substrate, there is provided an n-electrode 11 consisting of AuGeNi. It is preferred that the contact layers have as small energy gaps in the forbidden band as possible so that an ohmic contact with the metal can be obtained. FIG. 2 is a graph illustrating a relationship between an energy gap wavelength of an InGaAsP system and p-carrier concentration obtained by MOVPE. In the MOVPE method, as shown in FIG. 2, compositions having longer energy gap wavelengths can contain or be doped with more p-dopant. Hence, it is InGaAs that has been used commonly as a contact layer among InGaAsP compositions.

FIG. 3 is an energy band diagram illustrating energy bands of a p+-InGaAs contact layer and a p-InP clad layer of the conventional buried heterostructure laser fabricated by MOVPE. Holes from the p-electrode are injected into the semiconductor laser and migrate in a valence band of the energy band and are injected into the active layer. The InP clad layer 101 on the active layer has an energy gap of 1.4 eV while the InGaAs layer 102, contact layer, has an energy gap of 0.75 eV. When p-semiconductors having different energy gaps are connected, holes will migrate from the wide gap to the narrow gap, thus yielding a layer in which holes accumulate. As a result, there appears a notch 103 having an energy difference or barrier of $\Delta E_{v1}$ that prevents the migration of holes. Therefore, it is difficult for current to flow until the voltage reaches a value above which positive holes can pass over the barrier. This results in a high differential resistance of the laser.

FIG. 4 is a graph illustrating a current vs. differential resistance curve of the buried heterostructure laser fabricated as described above. The laser oscillates at 10 mA. However, the differential resistance of the laser near threshold is about 8 ohms (Ω) and is approaching gradually to about 6Ω with increasing current. The modulation rate of the laser is controlled depending on capacitance, C, and resistance, R. The laser has an electric cut-off frequency of $f=\frac{1}{2\pi RC}$. From this it is apparent that it is essential to decrease the resistance in order to conduct a high frequency modulation. This condition, i.e., low resistance, is further necessary for the operation of a laser at high temperature and for high output power thereof since the heat generation depends on the resistance of the device.

Next, explanation will be made on a conventional high resistive buried heterostructure laser. A semi-insulating high resistive buried heterostructure laser has been developed as a light source for high frequency modulation since its capacitance can be decreased to a certain extent. FIG. 5 is a cross-sectional view showing the semi-insulating buried heterostructure laser reported by N. Nordell et al (cf. MOVPE regrowth of semi-insulating InP around reactive ion etched laser mesas, Electronics Letters, pp. 926–927, vol. 27, 1991). As shown in FIG. 5, on an n-InP substrate 12, there are grown sequentially a multiple quantum well structure active layer 13 having an oscillating wavelength of 1.55 μm, a p-InP clad layer 14, and a p+-InGaAs contact layer 15 by MOVPE. The resulting structure is processed into a mesa stripe of about 2 to 2.5 μm wide. Then, the mesa is buried with a high resistive iron-doped layer 16 by MOVPE. The laser thus obtained oscillates at a threshold current of 30 mA with an optical output power of 20 mW. However, use of an InGaAs as the contact layer causes the following problems. That is, the InGaAs has an energy gap of 0.75 eV and the energy gap difference between the semiconductor and the metal (Schottky barrier) can be decreased when an AuZnNi alloy is used as a p-electrode material, thus realizing an ohmic contact having a low resistance. However, since the mesa structure is vertical, the width of the p-contact layer 15 has to be as small as 2 μm. This results in a high resistance at a current near threshold so that modulation at not lower than 10 GHz is difficult to perform.

As a method for decreasing the resistance of a high resistive buried heterostructure laser, P. A. Morton et al. reported one having the structure as shown in FIG. 6 (25 GHz bandwidth 1.55 μm GaInAsP p-doped strained multiquantum-well lasers, Electronics Letters, pp. 2156–2157, vol. 28, 1992). The structure of the device shown in FIG. 6 is obtained as follows. First, on an n-InP substrate 17, there are grown sequentially an n-InP buffer layer 18, a multiple quantum well structure active layer 19, and a p-InP layer 20. After processing to form a mesa, a first burying growth is performed to grow an iron-doped InP layer 21 and an n-InP layer 22. Then, a second burying growth is performed to grow a p-InP layer 23 overall the surface of the resulting structure and then a $p^+$-InGaAs contact layer 24. A mesa of 15 μm wide is formed in order to decrease the resistance of the device. In a third burying growth, a high resistive InP layer 25 is grown. A p-electrode region is taken wide to decrease the resistance of the device to 2.3Ω to achieve a high frequency modulation up to 25 GHz. However, the above-described structure requires burying growth three steps. As a result, a decrease in yield tends to occur.

FIG. 7 is a cross-sectional view, taken in a direction of optical output, showing a BH semiconductor laser device as described in Japanese Patent Application Laying-open No. 20593/1985. The device is a 1.3 μm BH semiconductor laser device comprising an InGaAsP that is most suited as a light source for optical communication. A conventional method for fabricating a semiconductor device starts from the condition that the top of the mesa is lower than the surrounding portions. This method gives rise to a surface layer which suffers from crystal defects called "grafts" or ungrown portions due to growth of a mesa in the form of a groove. The occurrence of grafts or ungrown portions is unavoidable from the principle of a liquid phase epitaxial growth. As a result, problems arise on the yield and reliability of device. In view of the fact that the above-described crystal defect is due to the growth on a mesa in the form of a groove, the conventional device is fabricated by starting a growth including a growth of a layer just above a mesa in such a manner that the height of the mesa is higher than or equal to the height of the surface of the crystal surrounding the mesa (Japanese Patent Application Laying-open No. 20593/1985, page 1, upper right column, lines 9–16, page 2, upper left column, lines 3–7). More specifically, the conventional device is fabricated as follows. First, on an n-InP substrate 30, there are sequentially grown by a conventional liquid phase growth four layers, i.e., an n-InP buffer layer 31, an InGaAsP active layer 32 whose lattice matches that of an InP having a bandgap energy, Eg, of 0.946 eV, a p-InP clad layer 33, and an InGaAsP cap (contact) layer 34 whose lattice matches that of an InP having a bandgap energy of 1.078 eV. An $SiO_2$ film 35 is provided as a mask on the thus-obtained multilayer structure, and a mesa of the layers 31 to 34 is formed by a conventional wet chemical etching. Thereafter, a p-InP blocking layer 36, an n-InP blocking layer 37, a p-InP blocking layer 38, and a contact layer 39 whose lattice matches that of an InP having a bandgap energy of 0.827 eV, are formed by burying growth. In this case, the burying growth is completed under the condition that the surface of the p-InP blocking layer 38 is lower than the surface of the InGaAsP contact layer 34. Next, the mask 35 is removed and the contact layer 39 is formed by a liquid phase growth. The contact layer 39 is comprised of an InGaAsP composition which has a bandgap energy smaller than that of the cap layer 34 and allows contact resistance with an anode provided in a subsequent fabrication step to decrease. However, the contact layer 39 cannot be provided on the position of the layer 34 (cf. Japanese Patent Application Laying-open No. 20593/1985, page 2, upper left column, line 10 to upper right column, line 7, FIG. 4).

SUMMARY OF THE INVENTION

An object of the present invention is to provide a buried heterostructure laser fabricated by MOVPE which laser has a relatively low device resistance that enables a high frequency modulation.

As a result of intensive investigation, it has now been found that provision of a multiple contact layer in a semiconductor laser fabricated by MOVPE and rendering the energy gap between a metal for electrode and the layer that contacts the metal smaller give rise to a contact having a smaller Schottky barrier. A structure in which energy gaps of from the clad layer to the metal electrode decrease stepwise meets the object of the present invention.

According to an aspect of the present invention, there is provided a semiconductor laser comprising:

(a) a semiconductor substrate of a first conductivity type;

(b) a mesa stripe portion comprising a multilayer structure comprising:

(b-1) an active layer provided on the semiconductor substrate;

(c) a buried current blocking layer arranged on both sides of the mesa stripe portion;

(d) a clad layer of a second conductivity type provided on the semiconductor substrate through at least a portion of the active layer;

(e) a contact layer of the second conductivity type provided on the clad layer, the contact layer comprising a first contact layer contacting the clad layer and a second contact layer provided on the first contact layer, the first contact layer having an energy gap smaller than that of the clad layer and larger than that of the second contact layer.

Here, (f) the first contact layer may have an energy gap within the range of from 0.82 eV to 1.12 eV.

The buried current blocking layer may comprise a bilayer structure provided on the semiconductor substrate, the bilayer structure comprising a lower semiconductor layer of the second conductivity type provided on the semiconductor substrate and an upper semiconductor layer of the first conductivity type provided on the lower semiconductor layer.

The buried current blocking layer may comprise a high resistive semiconductor layer.

The high resistive semiconductor layer may comprise a high resistive iron-doped InP layer.

The first contact layer may comprise an InGaAsP semiconductor layer having an energy gap within the range of from 0.82 eV to 1.12 eV, wherein the second contact layer may be selected from the group consisting of an InGaAs semiconductor layer and an InGaAsP semiconductor layer which has an energy gap of 0.8 eV, and wherein the clad layer contacting the first contact layer may comprise an InP layer.

The contact layer may further comprise a third contact layer comprising an InGaAsP semiconductor layer, the third contact layer intervening between the first and second contact layers, and wherein the first contact layer may have an energy gap smaller than that of the clad layer and the third contact layer may have an energy gap smaller than that of the first contact layer but greater than that of the second contact layer.

The first contact layer may comprise an InGaAsP semiconductor layer having an energy gap within the range of from 0.82 eV to 1.12 eV, wherein the second contact layer may be selected from the group consisting of an InGaAs semiconductor layer and an InGaAsP semiconductor layer which has an energy gap of 0.8 eV, and wherein the clad layer contacting the first contact layer may comprise an InP layer.

The mesa stripe portion may be vertical to a main surface of the semiconductor substrate.

Further, (b-2) the clad layer of the second conductivity type may be provided on the active layer in the mesa stripe portion; and the first and second contact layers may be provided on the clad layer in the mesa stripe portion.

The buried current blocking layer may comprise a high resistive semiconductor layer.

The high resistive semiconductor layer may comprise a high resistive iron-doped InP layer.

The first contact layer may comprise an InGaAsP semiconductor layer having an energy gap within the range of from 0.82 eV to 1.12 eV, wherein the second contact layer may be selected from the group consisting of an InGaAs semiconductor layer and an InGaAsP semiconductor layer which has an energy gap of 0.8 eV, and wherein the clad layer contacting the first contact layer may comprise an InP layer.

The contact layer may further comprise a third contact layer comprising an InGaAsP semiconductor layer, the third contact layer intervening between the first and second contact layers, and wherein the first contact layer may have an energy gap smaller than that of the clad layer and the third contact layer may have an energy gap smaller than that of the first contact layer but greater than that of the second contact layer.

The first contact layer may comprise an InGaAsP semiconductor layer having an energy gap within the range of from 0.82 eV to 1.12 eV, wherein the second contact layer may be selected from the group consisting of an InGaAs semiconductor layer and an InGaAsP semiconductor layer which has an energy gap of 0.8 eV, and wherein the clad layer contacting the first contact layer may comprise an InP layer.

The mesa stripe portion may be vertical to a main surface of the semiconductor substrate.

Furthermore, (b-2) the clad layer of the second conductivity type may be provided on the active layer in the mesa stripe portion;

the laser further comprising:

(g) a semiconductor layer of the second conductivity type provided on an upper portion of the mesa stripe portion and the buried current blocking layer;

(h) the first contact layer being provided on the semiconductor of the second conductivity type and the second contact layer being provided on the first contact layer, the first contact having an energy gap smaller than that of the semiconductor layer of the second conductivity type but greater than that of the second contact layer.

The buried current blocking layer may comprise a bilayer structure comprising a semiconductor layer of the second conductivity type provided on the semiconductor substrate and a semiconductor layer of the first conductivity type provided on the semiconductor layer of the first conductivity type.

The buried current blocking layer may comprise a bilayer structure comprising a high resistive semiconductor layer and a semiconductor layer of the first conductivity type.

The high resistive semiconductor crystal layer may comprise a high resistive iron-doped InP layer.

The first contact layer may comprise an InGaAsP semiconductor layer having an energy gap within the range of from 0.82 eV to 1.12 eV, wherein the second contact layer may be selected from the group consisting of an InGaAs semiconductor layer and an InGaAsP semiconductor layer which has an energy gap of 0.8 eV, and wherein the clad layer contacting the first contact layer may comprise an InP layer.

The contact layer further may comprise a third contact layer comprising an InGaAsP semiconductor layer, the third contact layer intervening between the first and second contact layers, and wherein the first contact layer may have an energy gap smaller than that of the clad layer and the third contact layer has an energy gap smaller than that of the first contact layer but greater than that of the second contact layer.

The first contact layer may comprise an InGaAsP semiconductor layer having an energy gap within the range of from 0.82 eV to 1.12 eV, wherein the second contact layer may be selected from the group consisting of an InGaAs semiconductor layer and an InGaAsP semiconductor layer which has an energy gap of 0.8 eV, and wherein the clad layer contacting the first contact layer may comprise an InP layer.

The mesa stripe portion may be vertical to a main surface of the semiconductor substrate.

As described above, according to the present invention, a low resistive semiconductor laser which permits high outputs, high temperature operations, and high frequency modulations.

The above and other objects, effects, features and advantages of the present invention will become more apparent from the following description of the embodiment thereof taken in conjunction with the accompanying drawings.

DESCRIPTION OF PREFERRED EMBODIMENTS

Hereinafter, the present invention will be described in greater detail by embodiments with reference to the attached drawings. However, the present invention should not be construed as being limited thereto.

Figure 1:
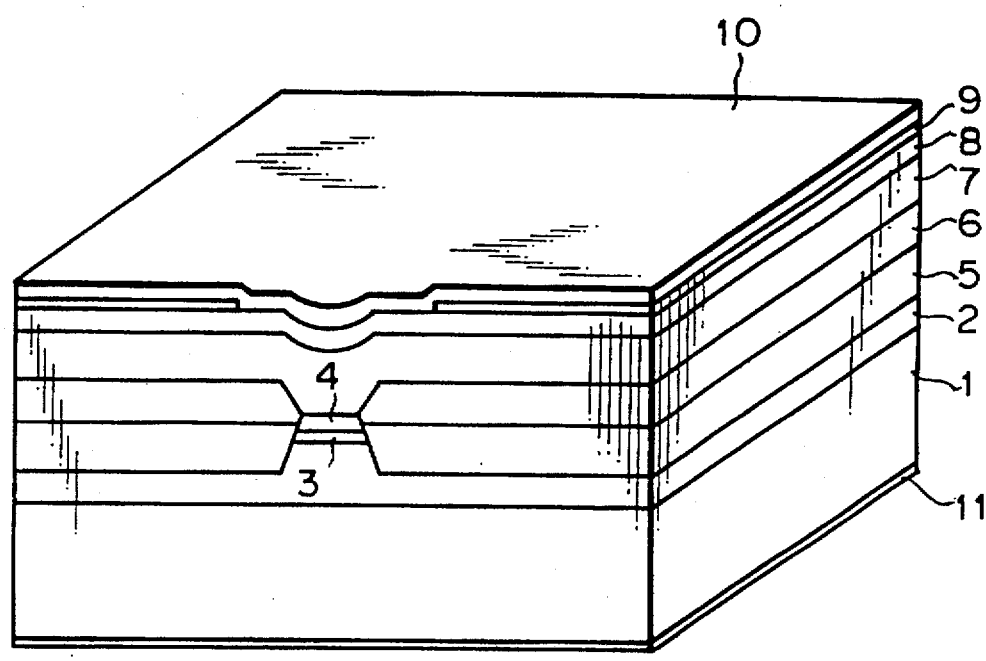
FIG. 1 is a cross-sectional perspective view showing a conventional buried heterostructure laser diode grown entirely by a metal organic vapor phase epitaxy.
Figure 2:
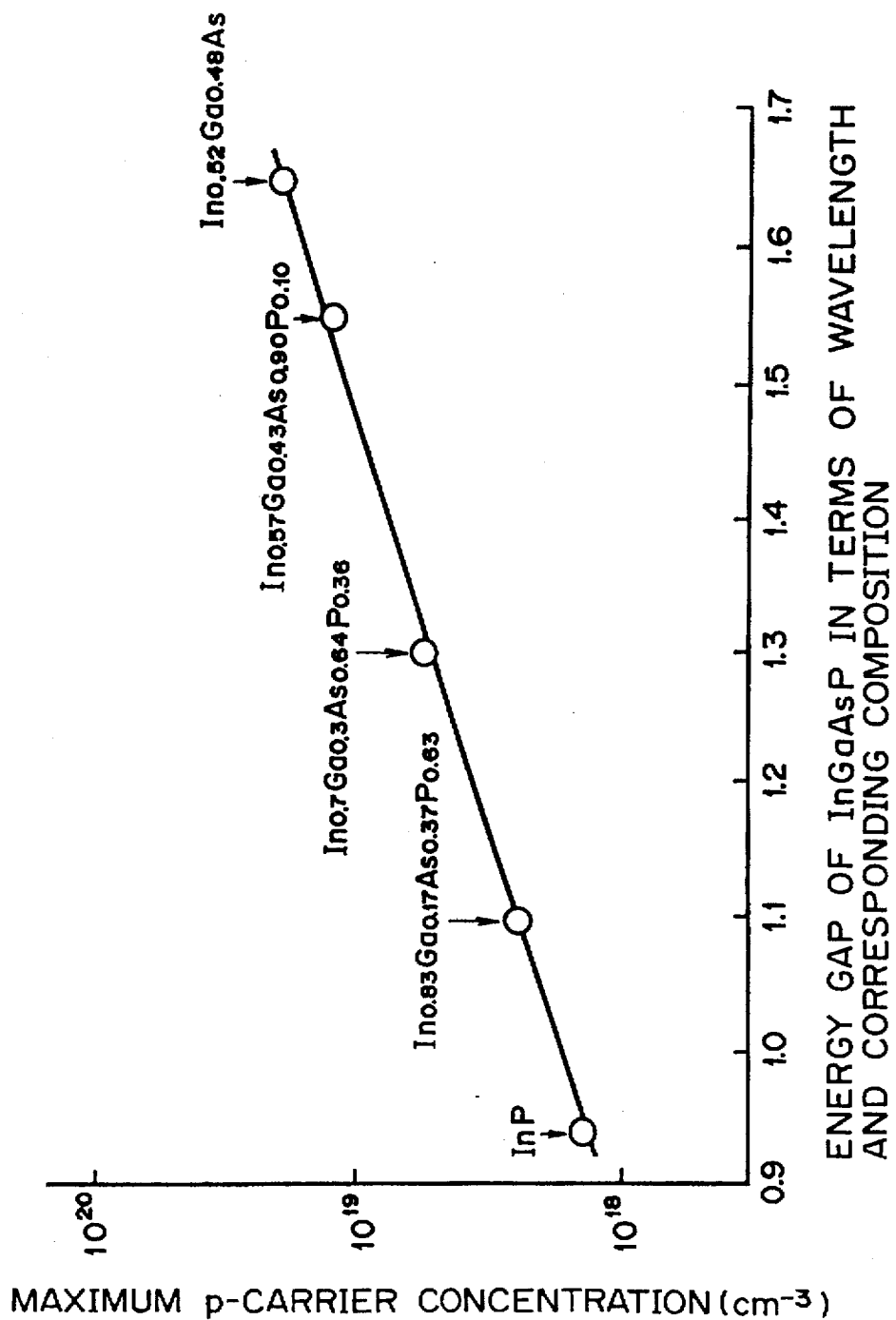
FIG. 2 is a graph illustrating a relationship between an energy gap wavelength of an InGaAsP system and concentration of a p-dopant which can be doped by MOVPE.
Figure 3:
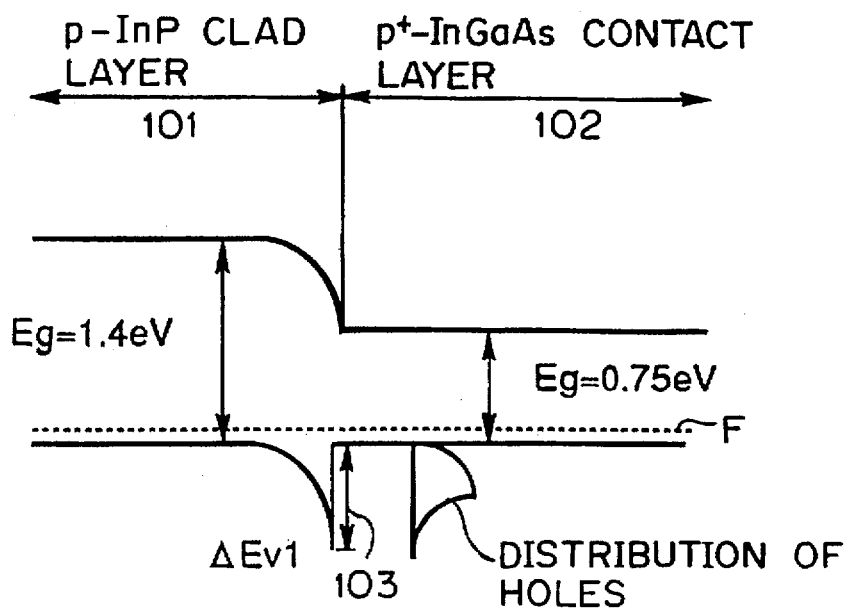
FIG. 3 is an energy band diagram illustrating energy bands of a p⁺-InGaAs contact layer and a p-InP clad layer of the conventional buried heterostructure laser fabricated by MOVPE.
Figure 8:
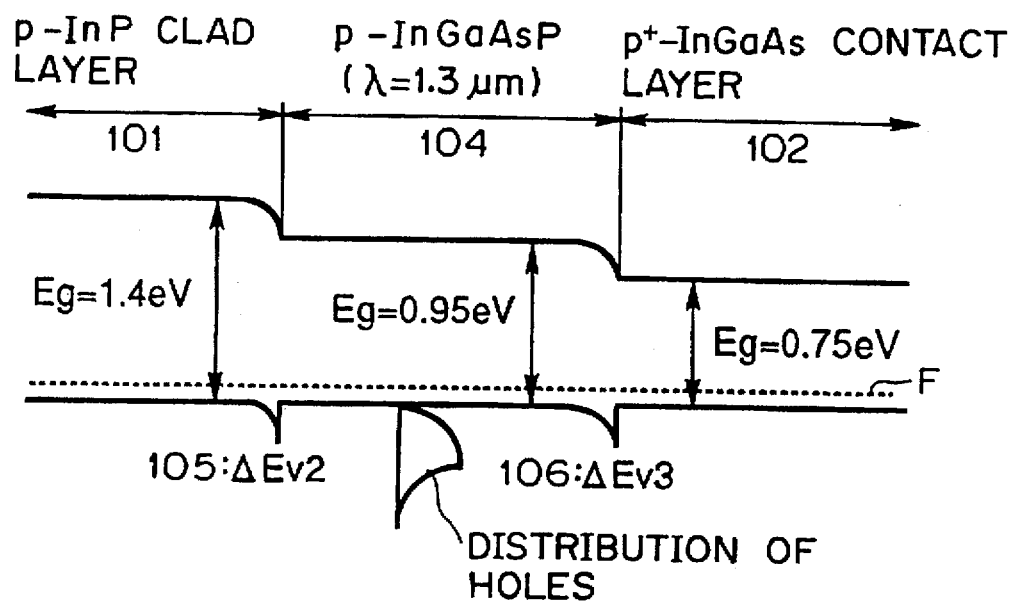
FIG. 8 is a diagram illustrating energy bandgaps of a double contact layer and a p-InP clad layer in a buried heterostructure semiconductor laser according to an embodiment of the present invention.

FIG. 8 is illustrates energy bandgaps of a double contact layer and a p-InP clad layer in a buried heterostructure semiconductor laser according to an embodiment of the present invention. Like the energy band diagram of the p$^+$-InGaAs contact layer and p-InP clad layer in the conventional buried heterostructure laser as shown in FIG. 3, the InP clad layer on the active layer of the device of the present invention has an energy gap 101 of 1.4 eV and the InGaAs layer, contact layer, has an energy gap 102 of 0.75 eV. In the present invention, the contact layer comprises a plurality of layers which have stepwise increasing energy gaps from the p$^+$-InGaAs contact layer having the energy gap 102 (Eg=0.75 eV), i.e., the second contact layer contacting the metal to the p-InGaAsP layer having the energy gap 104 (energy gap wavelength λ=1.3 μm; Eg=0.95 eV), i.e., the first contact layer, which contacts the p-InP clad layer having the energy gap 101 (Eg=1.4 eV). This arrangement decreases the heights of barriers (ΔEv2, ΔEv3) 105 and 106 due to accumulation of holes, thus permitting efficient injection of holes from the metal electrode into the clad layer. As a result, the resistance of the device decreases.

Figure 7:
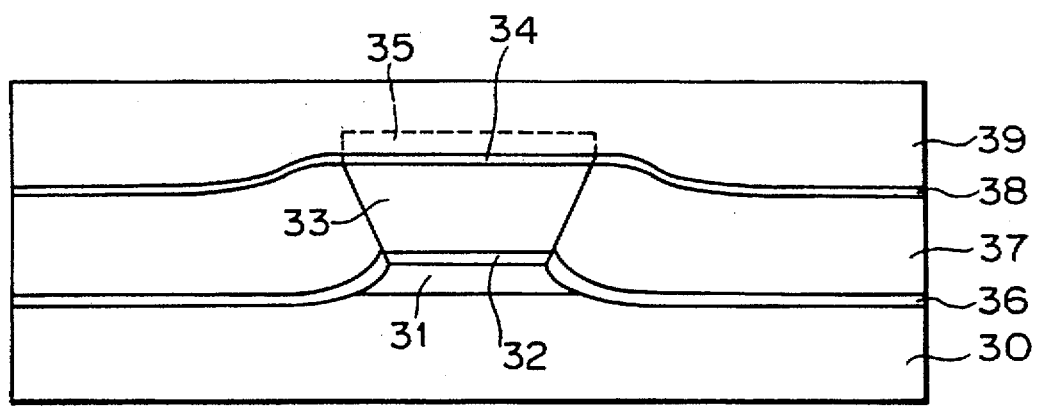
FIG. 7 is a cross-sectional view showing a conventional BH semiconductor laser device taken in a direction of optical output.

Further, unlike the arrangement shown in FIG. 7 (cf. Japanese Patent Application Laying-open No. 20593/1985), the semiconductor laser of the present invention comprises first and second semiconductor layers constituting the contact layer and differing in energy gap so that the efficiency of injection of holes increases. In the arrangement of the contact layer in the present invention, the second contact layer has the same width as the first contact layer. This also increases the efficiency of injection of holes from the second contact layer into the first contact layer. Since the first and second contact layers are formed continuously, the process of fabricating the device is simplified and it is possible to increase yield of fabrication of the device.

Embodiment 1

Figure 9:
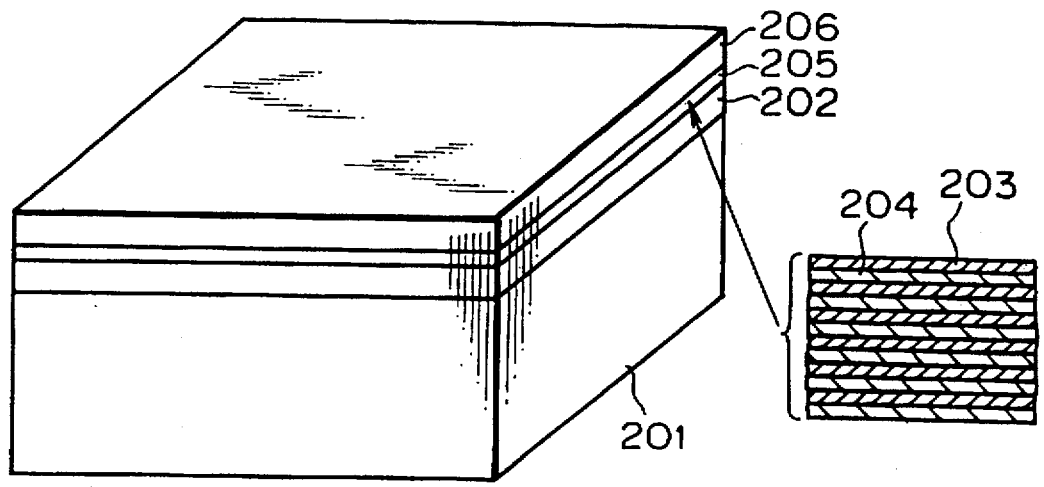
FIG. 9 is a cross-sectional perspective view showing a product produced during a step of a fabrication method for fabricating a buried heterostructure laser according to an embodiment of the present invention.
Figure 10:
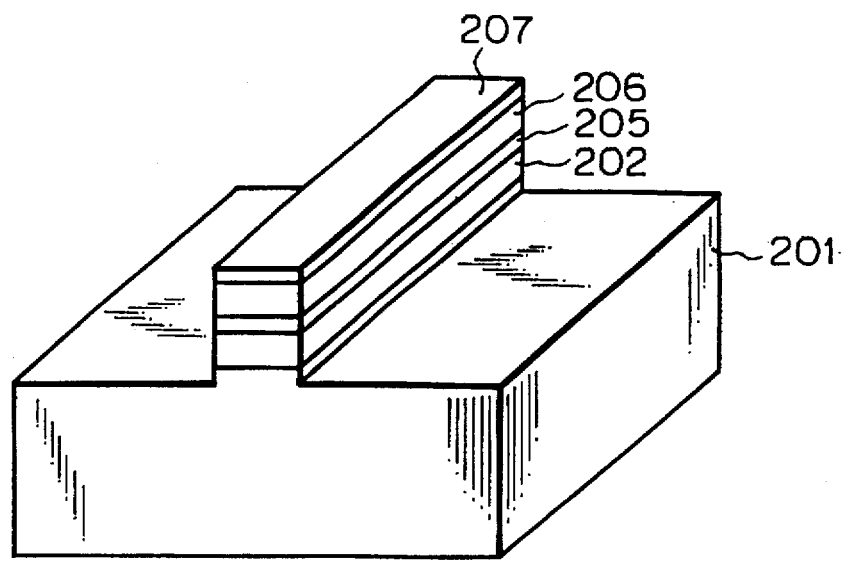
FIG. 10 is a cross-sectional perspective view showing a product produced during a step of a fabrication method for fabricating a buried heterostructure laser according to an embodiment of the present invention.
Figure 11:
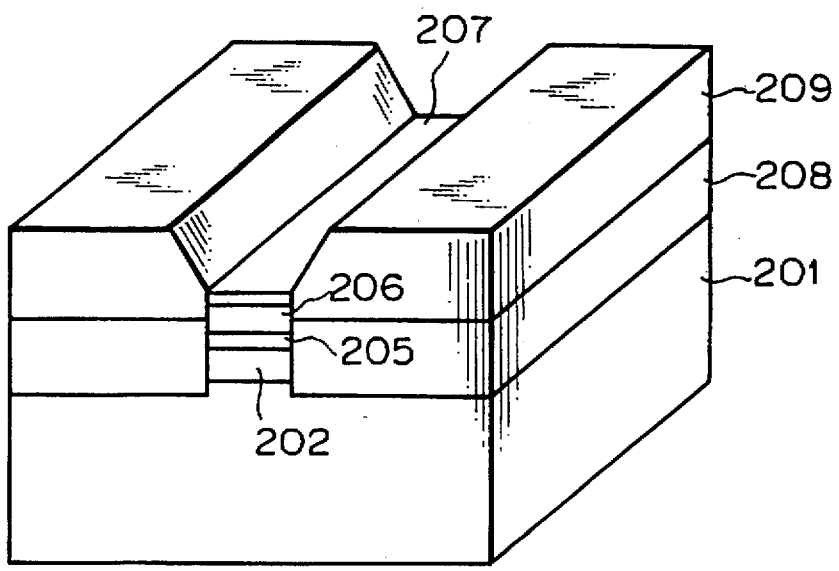
FIG. 11 is a cross-sectional perspective view showing a product produced during a step of a fabrication method for fabricating a buried heterostructure laser according to an embodiment of the present invention.
Figure 12:
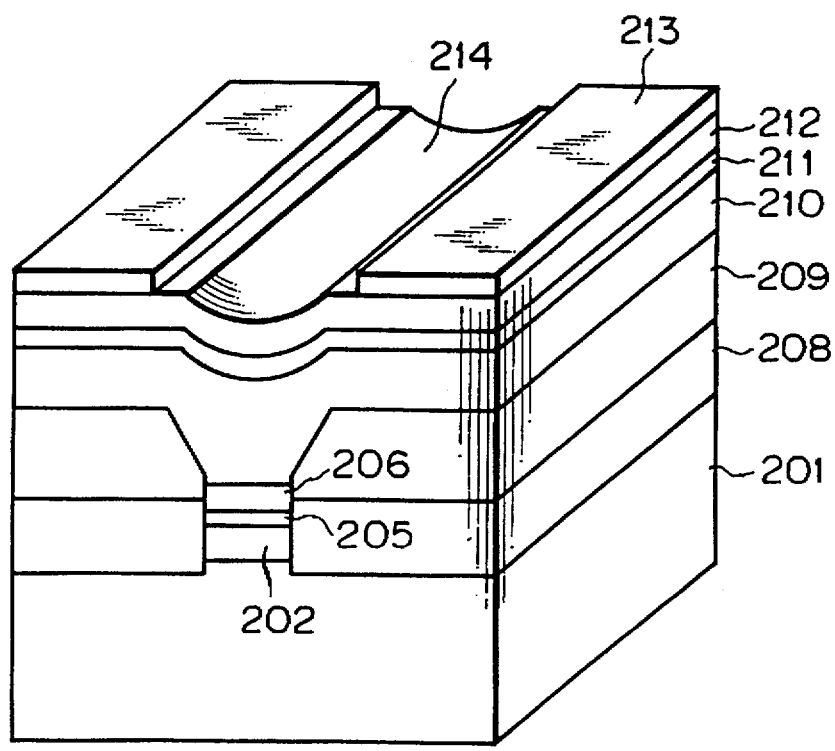
FIG. 12 is a cross-sectional perspective view showing a product produced during a step of a fabrication method for fabricating a buried heterostructure laser according to an embodiment of the present invention.
Figure 13:
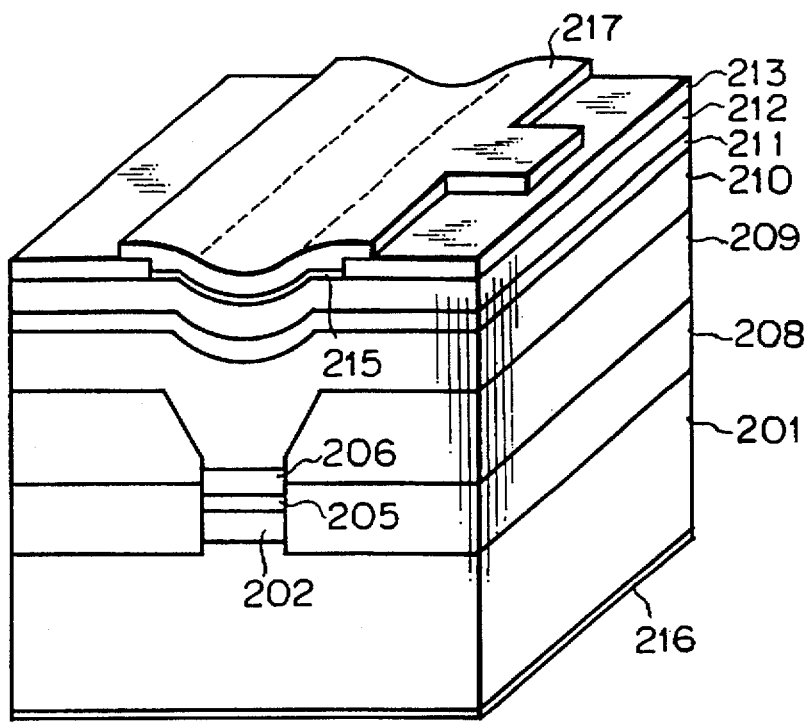
FIG. 13 is a cross-sectional perspective view showing a product produced during a step of a fabrication method for fabricating a buried heterostructure laser according to an embodiment of the present invention.

The instant embodiment is a first embodiment of the present invention. With reference to FIGS. 9–13, fabrication of the semiconductor laser according to the first embodiment of the present invention will be described below. Here, an InGaAsP/InP laser was taken as an example. As shown in FIG. 9, an n-InP substrate 201 having an n-carrier concentration of 2×10$^{18}$ c$^{-3}$ was provided, on which an n-InP buffer layer 202 having an n-carrier concentration of 2×10$^{18}$ cm$^{-3}$ and a thickness of 0.5 μm, a strained quantum well active layer 205 having 6 to 12 wells including InGaAs wells 203 and InGaAsP (energy gap wavelength λ=1.3 μm) barriers 204, and a p-InP clad layer 206 having a p-carrier concentration of 2×10$^{17}$ cm$^{-3}$ and a thickness of 0.5 μm were grown sequentially by MOVPE. Then, an SiO$_2$ film was deposited by sputtering on a surface of the resulting structure. An SiO$_2$ stripe mask 207 was formed on the growth surface by a conventional photolisography and dry etching with CF$_4$ and H$_2$ as an active gas. The stripe was 1.5 μm wide in order to obtain a single transverse mode laser beam. The mesa to be buried was etched down just below the active layer by a conventional reactive ion etching (RIE) method using a mixed gas consisting of ethane and hydrogen so that the resulting mesa had a height of about 1 μm. In the case of the RIE method using ethane gas as an active gas, there was formed a mesa having vertical side walls as shown in FIG. 10. The SiO$_2$ stripe mask 207 was left as it was as a mask for selective growth and the mesa stripe was buried on the both sides thereof with a p-InP layer 208 having a p-carrier concentration of 10$^{17}$ cm$^{-3}$ and a thickness of 0.7 μm and an n-InP layer 209 having an n-carrier concentration of 10$^{17}$ cm$^{-3}$ and a thickness of 0.7 μm. In this case, an iron-doped high resistive InP layer may be used instead of the p-InP layer described above. The selective burying growth gave the structure shown in FIG. 11. Then, the SiO$_2$ mask 207 was removed with hydrofluoric acid. Overall the surface, there were sequentially grown a p-InP layer 210 having a p-carrier concentration of $10^{17}$ cm$^{-3}$ and a thickness of 1.5 μm, a p-InGaAsP layer 211 having an energy gap wavelength λ=1.3 μm, a p-carrier concentration of $7\times10^{17}$ cm$^{-3}$, and a thickness of 0.1 μm, a p$^+$-InGaAs layer 212 having a thickness of 0.5 μm. The layer 212 may be an InGaAsP semiconductor layer having an energy gap of 0.8 eV. An SiO$_2$ film 213 was deposited on the resulting surface and a window 214 for an electrode was formed by a conventional photolisography and a conventional dry etching method (FIG. 12). Thereafter, the bottom surface of the substrate was polished to render the wafer about 100 μm thick. A p-electrode 215 of AuZnNi was formed in the window 214 on the main surface of the substrate only in the window by a lift-off process. On the bottom surface of the substrate was deposited an AuGeNi layer 216 as an n-electrode, which was sintered at about 420° C. in a nitrogen atmosphere. Further, for bonding purposes, gold 217 was plated on the current-introducing window 214 and a pad portion as shown in FIG. 13. A laser chip formed by cleaving was 300 μm long.

Figure 4:
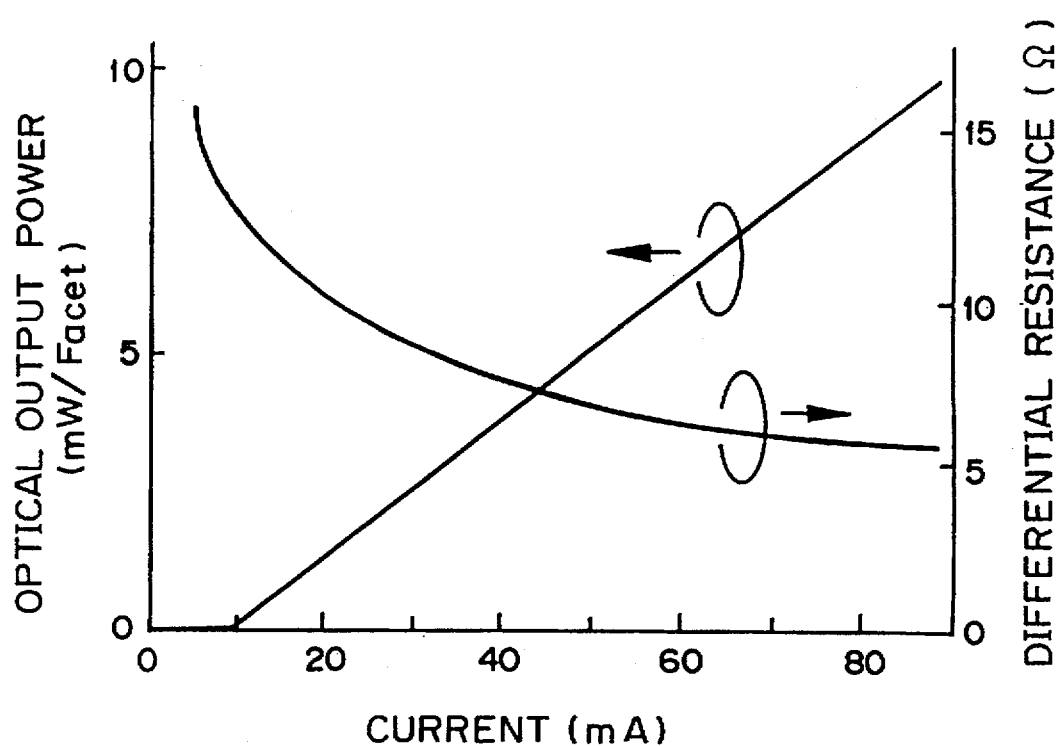
FIG. 4 is a graph illustrating a current vs. differential resistance curve of a conventional buried heterostructure laser fabricated by a conventional method.
Figure 5:
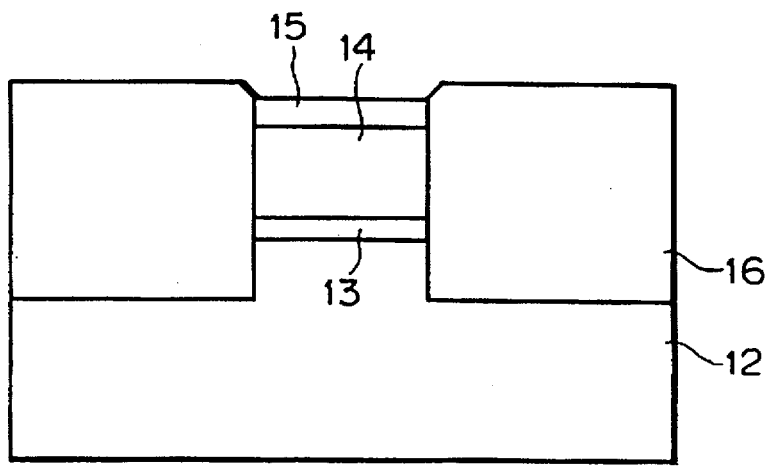
FIG. 5 is a cross-sectional view showing a conventional semi-insulating buried heterostructure laser.
Figure 6:
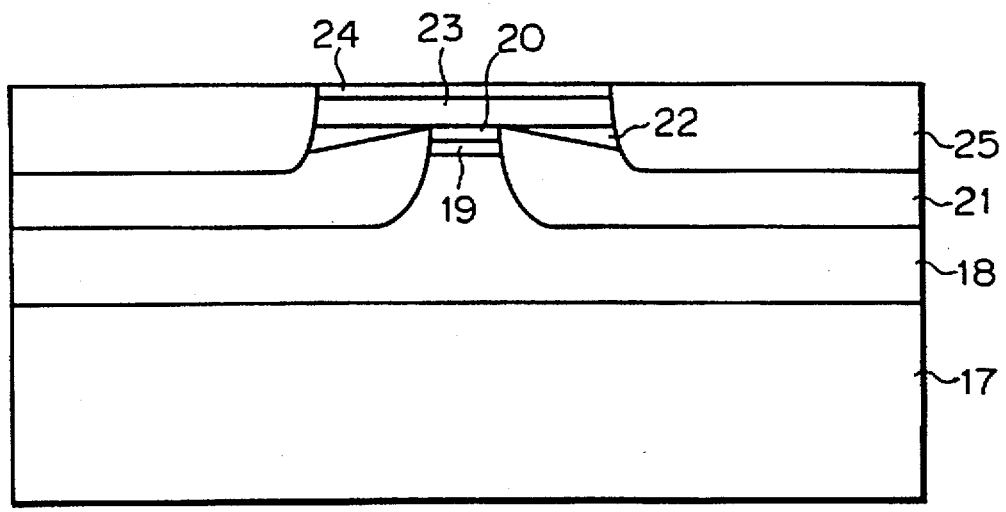
FIG. 6 is a cross-sectional view showing a conventional semi-insulating high resistive buried heterostructure laser fabricated by a conventional three steps burying growth.

Next, the operation of the above-described buried heterostructure laser will be described. The threshold current was 10 mA and optical output at 80 mA was 15 mW. The line representing the current vs. differential resistance curve of the laser bends at the threshold current and is fixed to a constant value of 2Ω at a current exceeding the threshold current, showing very good characteristics. Note that in contrast to the present invention, the current vs. differential resistance of the laser whose contact layer consists of InGaAs alone showed a relatively high resistance at a threshold current without any clear bending around the threshold current as shown in FIG. 4. It is believed that positive holes are difficult to migrate from the InGaAs layer to the InP layer due to the energy barrier (ΔEv1) 103. The buried heterostructure laser having the contact layer arrangement according to the instant embodiment gave 20 GHz in a 3 dB bandwidth due to a decrease in the resistance. Lasing was confirmed up to 150° C.

Embodiment 2

Figure 15:
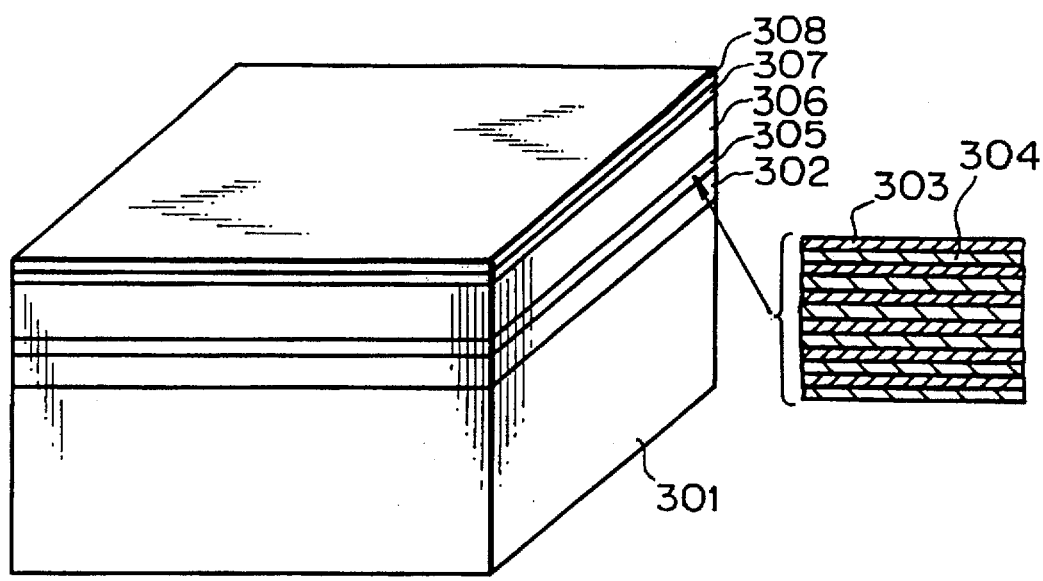
FIG. 15 is a cross-sectional perspective view showing a product produced during a step of a fabrication method for fabricating a semi-insulating buried heterostructure laser according to an embodiment of the present invention.
Figure 16:
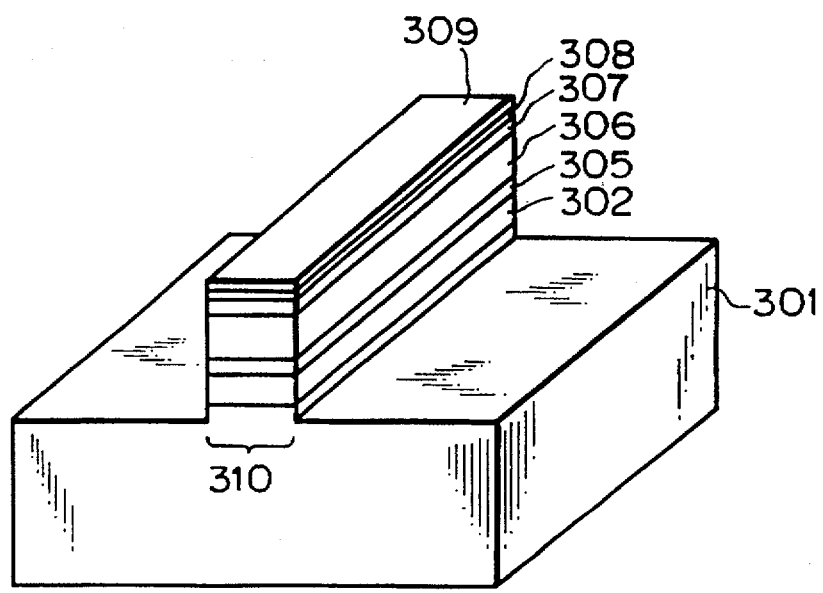
FIG. 16 is a cross-sectional perspective view showing a product produced during a step of a fabrication method for fabricating a semi-insulating buried heterostructure laser according to an embodiment of the present invention.
Figure 17:
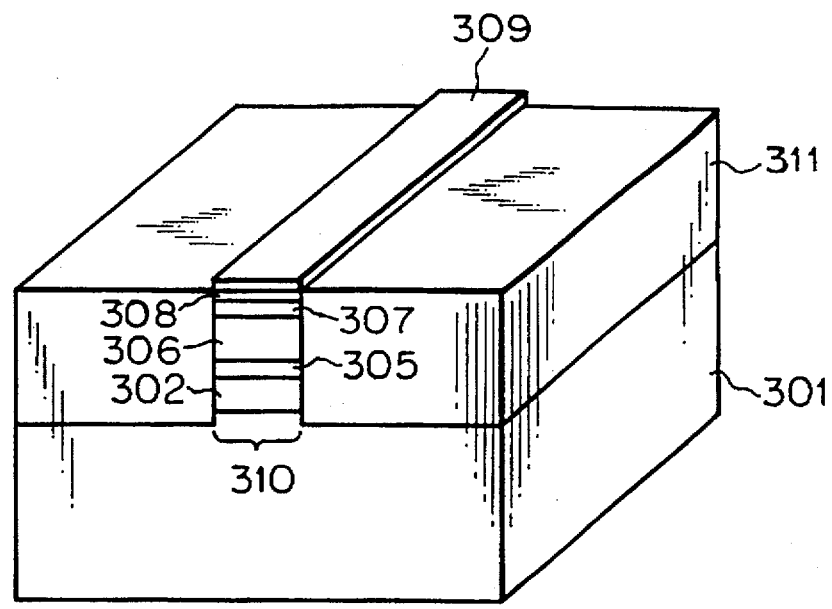
FIG. 17 is a cross-sectional perspective view showing a product produced during a step of a fabrication method for fabricating a semi-insulating buried heterostructure laser according to an embodiment of the present invention.
Figure 18:
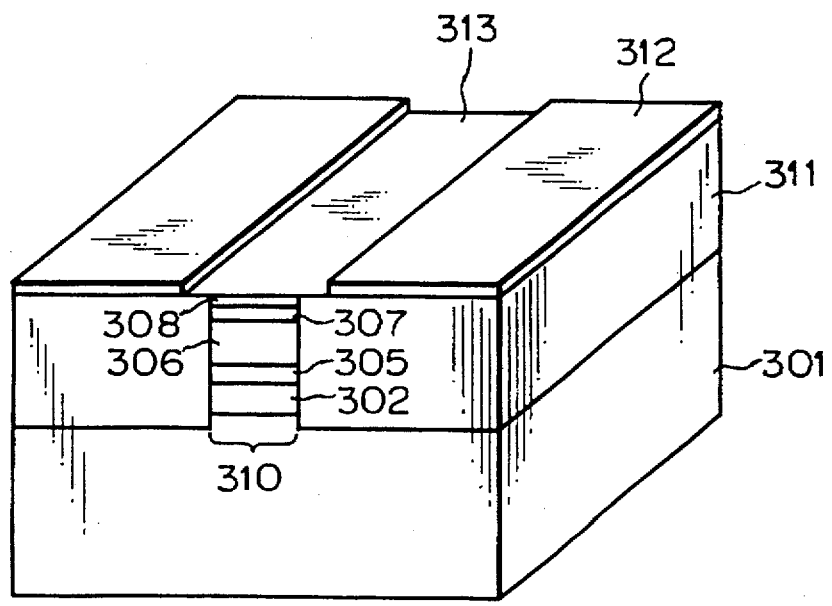
FIG. 18 is a cross-sectional perspective view showing a product produced during a step of a fabrication method for fabricating a semi-insulating buried heterostructure laser according to an embodiment of the present invention.
Figure 19:
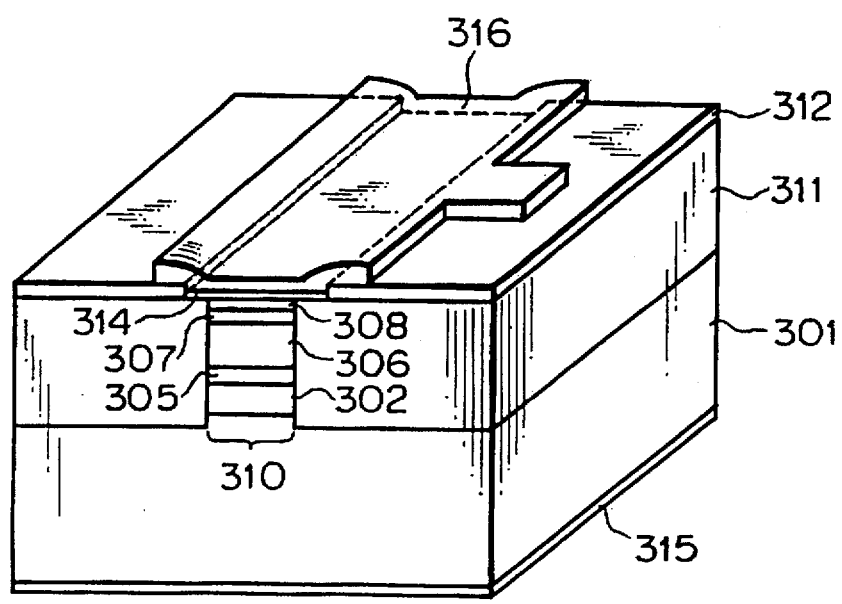
FIG. 19 is a cross-sectional perspective view showing a product produced during a step of a fabrication method for fabricating a semi-insulating buried heterostructure laser according to an embodiment of the present invention.

The instant embodiment is a second embodiment of the present invention. With reference to FIGS. 15–19, fabrication of the semiconductor laser according to the second embodiment of the present invention will be described below. Here, an InGaAsP/InP laser was taken as an example as in Embodiment 1. In FIG. 15, an n-InP substrate 301 having an n-carrier concentration of $2\times10^{18}$ cm$^{-3}$ was provided, on which an n-InP buffer layer 302 having an n-carrier concentration of $2\times10^{18}$ cm$^{-3}$ and a thickness of 0.5 μm, strained quantum well active layers 305 having 6 to 12 wells including InGaAs wells 303 and InGaAsP (energy gap wavelength λ=1.3 μm) barriers 304, a p-InP clad layer 306 having a p-carrier concentration of $2\times10^{17}$ cm$^{-3}$ and a thickness of 1.5 μm, a p-InGaAsP layer (energy gap wavelength λ=1.3 μm) 307 having a p-carrier concentration of $2\times10^{18}$ cm$^{-3}$ and a thickness of 0.2 μm, and a p$^+$-InGaAs layer 308 having a p-carrier concentration of $5\times10^{18}$ cm$^{-3}$ and a thickness of 0.3 μm were grown sequentially by MOVPE. The layer 308 may be an InGaAsP semiconductor layer having an energy gap of 0.8 eV. Then, an SiO$_2$ film was sputtered on a burying growth surface of the resulting structure. An SiO$_2$ stripe mask 309 was formed on the growth surface by a conventional photolisography and dry etching with CF$_4$ and H$_2$ as an active gas. The stripe was 1.5 μm wide in order to obtain a single transverse mode laser beam. The mesa stripe to be buried was etched down just below the active layer by reactive ion etching (RIE) method using a mixed gas consisting of ethane and hydrogen so that the resulting mesa had a height of about 2.7 μm. In the case of the RIE method using ethane gas as an active gas, there was formed a mesa 310 having vertical side walls as shown in FIG. 16. The SiO$_2$ stripe mask 309 was left as it was as a mask for a subsequent selective growth and the mesa stripe was buried on the both sides thereof with an iron-doped high resistive to give a structure shown in FIG. 11. After removal of the SiO$_2$ mask 309, an SiO$_2$ film 312 was deposited on the resulting surface and a window 313 was formed by a conventional photolisography and a conventional dry etching method (FIG. 18). Thereafter, the bottom surface of the substrate was polished to render the wafer about 100 μm thick. A p-electrode 313 of AuZnNi was formed on the main surface of the substrate but only in the window 313 by a lift-off process. On the bottom surface of the substrate, there was deposited an AuGeNi layer 315 as an n-electrode, which was sintered at about 420° C. in a nitrogen atmosphere. Further, for bonding purposes, gold 316 was plated on the current-introducing window 313 and a pad portion as shown in FIG. 19. A laser chip formed by cleaving was 300 μm long.

Figure 14:
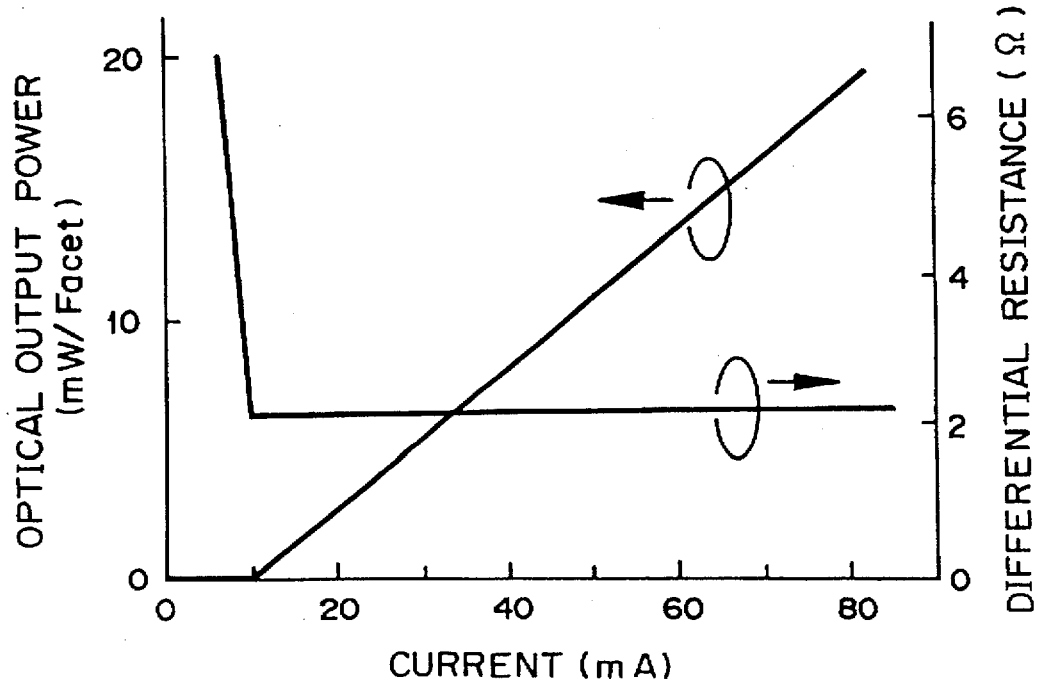
FIG. 14 is a graph illustrating a current vs. optical output power curve of a buried heterostructure laser with a double contact layer according to an embodiment of the present invention.

Next, the operation of the above-described buried heterostructure laser will be described. FIG. 14 illustrates a light vs. current curve of a buried heterostructure laser with the double contact layer according to the instant embodiment. The threshold current was 10 mA and optical output at 80 mA was 18 mW. The line representing the current vs. differential resistance curve of the laser bends at the threshold current and is fixed to a constant value of 2Ω at a current exceeding the threshold current similarly to FIG. 14, thus showing very good characteristics. The buried heterostructure laser having the double contact layer arrangement according to the instant embodiment gave 20 GHz in a 3 dB bandwidth due to a decrease in the resistance (about 2 pF).

Embodiment 3

Figure 20:
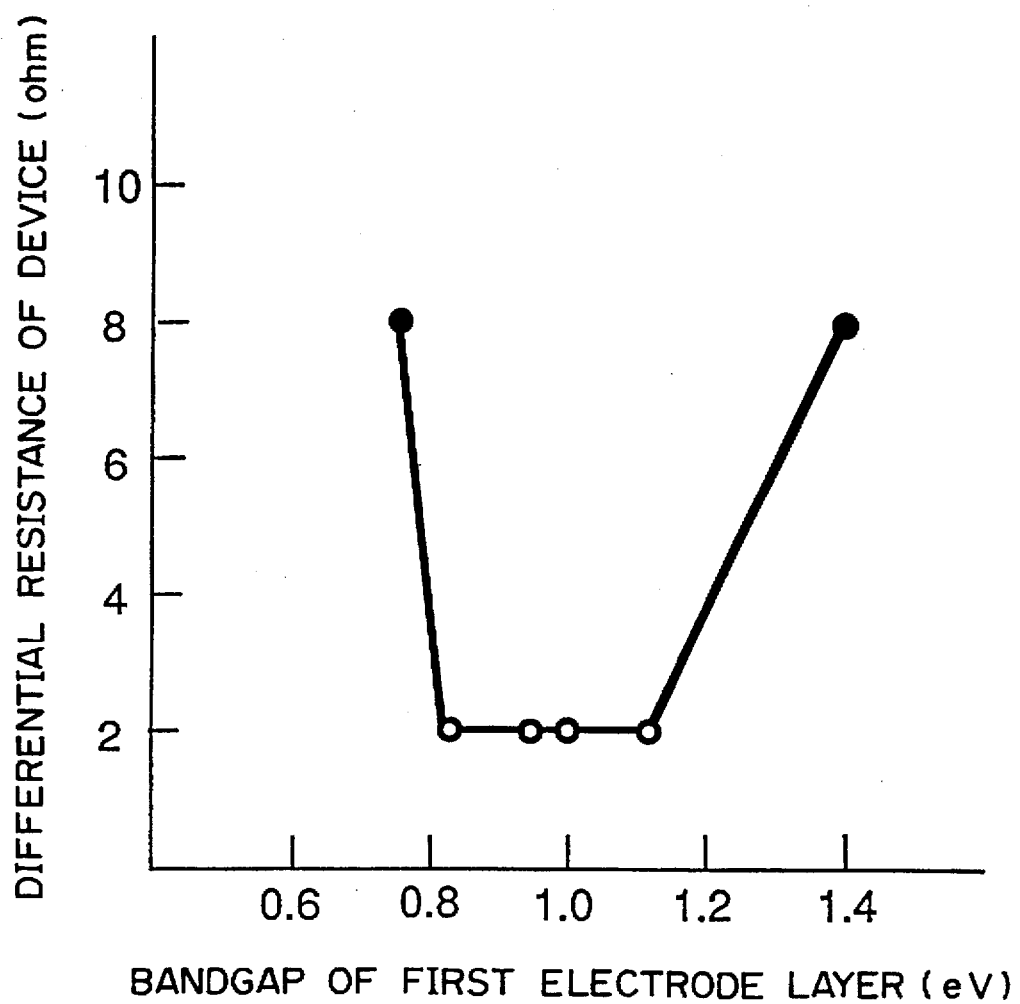
FIG. 20 is a graph illustrating a relationship between a bandgap range of a first contact layer and a resistance of the device in a buried heterostructure laser according to an embodiment of the present invention.

A plurality of heterostructure InGaAsP/InP lasers having a mesa stripe width of 1.5 μm and a device length of 300 μm were fabricated in the same manner as in Embodiment 1 except that the arrangement of the contact layer was varied. More particularly, p$^+$-InGaAs and p-InP were used as the second contact layer and the clad layer, respectively, and a p-InGaAsP layer having a varied bandgap was used as the first contact that intervenes between the clad layer and the second contact layer. These lasers were measured of their device resistance at the threshold current. FIG. 20 shows the results. It can be seen from FIG. 20 that when the InGaAsP layer as the first contact layer had a bandgap of from 0.82 eV to 1.12 eV, the device resistance was as low as about 2Ω as indicated by open circles (o). In contrast, the conventional laser having a p$^+$-InGaAs layer directly formed on the p-InP clad layer without an intervening first contact layer showed a device resistance of 8Ω as indicated by darkened circles (o). Thus, the buried heterostructure laser of the present invention had a device resistance much lower than the conventional laser having a similar arrangement but lacking a double contact structure.

Further, at a bandgap of the first contact layer within the range of from 0.82 eV to 1.12 eV, where efficiency of injection of holes increases, the device resistance depends primarily on the resistivity of the semiconductor layer itself. Since the resistivity of the InGaAsP layer remains almost constant within this range, the device resistance is constant at about 2Ω.

Variations

Figure 21:
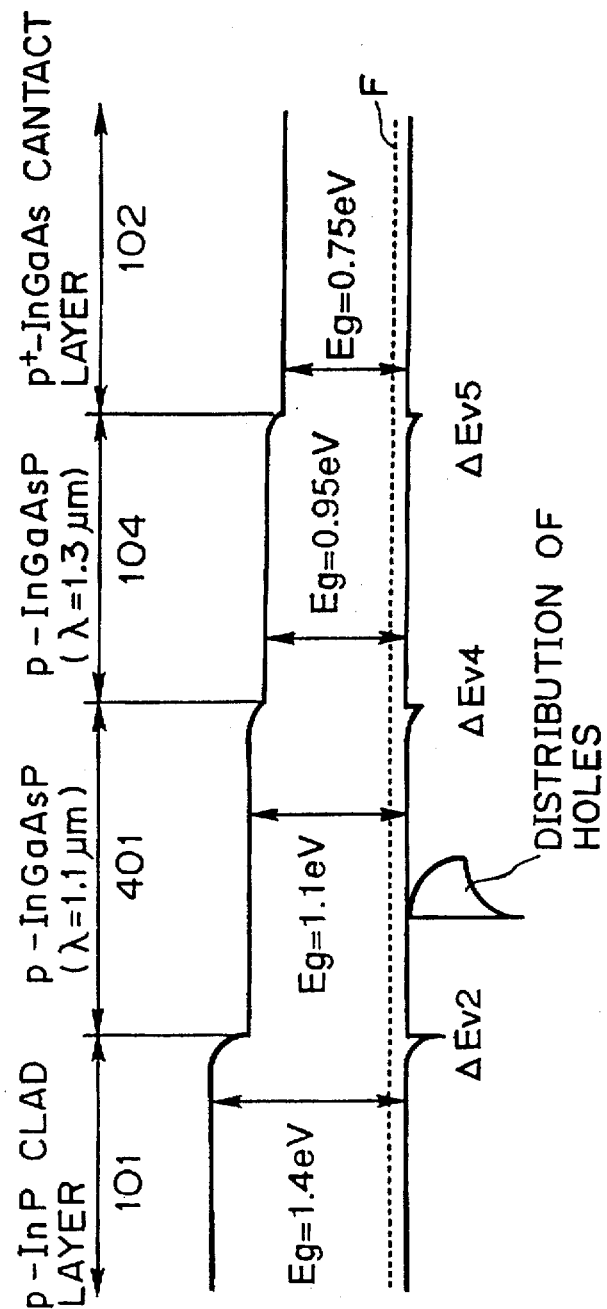
FIG. 21 is an energy band diagram illustrating an example of energy band structure having a contact layer and a clad layer of a buried heterostructure according to an embodiment of the present invention.
Figure 22:
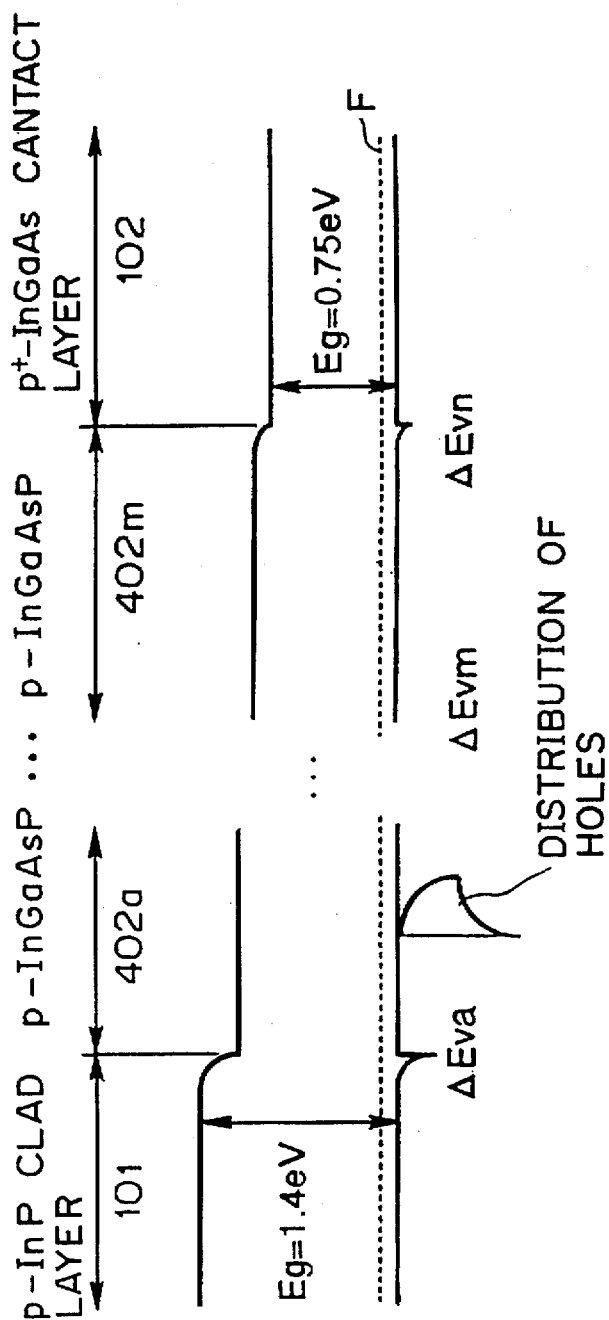
FIG. 22 is an energy band diagram illustrating another example of energy band structure having a contact layer and a clad layer of a buried heterostructure according to an embodiment of the present invention.

In the above-described embodiments, the contact layer used comprises two layers. However, it may comprise three or more layers. For example, as shown in FIG. 21, the contact layer may comprise a first p-InGaAsP layer having an energy gap wavelength λ=1.1 μm and a thickness of 0.1 μm, a second p-InGaAsP layer having an energy gap wavelength λ=1.3 μm and a thickness of 0.1 μm, and a p$^+$-InGaAs layer having a thickness of 0.5 μm. Alternatively, the contact layer may comprise a plurality of p-InGaAsP layers having stepwise decreasing energy gaps 402a, . . . , 402m, respectively, and a p$^+$-InGaAs contact layer having the energy gap 102 as shown in FIG. 22.

Although the above description has been made taking an InGaAsP/InP system as an example, the material of the contact layer is not limited thereto and various other materials such as InGaAs/InAlAs, GaAs/AlGaAs, etc. may be used. The active layer may be of an MQW structure, double heterostructure (DH) structure, etc. As for the conductivity type of materials, p-type and n-type may be interchanged.

The arrangement of the device is not limited to those described in the above-described embodiments and the present invention is applicable widely to buried heterostructure semiconductor lasers that includes a semiconductor substrate, a mesa stripe formed on the substrate, and a current blocking layer on both sides of the mesa.

The semiconductor substrate may comprise a (001) crystal, for example. However, the direction of crystal plane is not limited particularly in view of the principle on which the present invention is based.

The present invention has been described in detail with respect to an embodiment, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A semiconductor laser comprising:
   (a) a semiconductor substrate of a first conductivity type;
   (b) a mesa stripe portion comprising a multilayer structure comprising an active layer, provided on said semiconductor substrate;
   (c) a buried current blocking layer arranged on both sides of said mesa stripe portion;
   (d) a clad layer of a second conductivity type provided over said semiconductor substrate through at least a portion of said active layer; and
   (e) a contact layer of the second conductivity type provided on said clad layer, said contact layer comprising a first contact layer contacting said clad layer and a second contact layer provided on said first contact layer, said first contact layer having an energy gap less than that of said clad layer and greater than that of said second contact layer,
   wherein said first contact layer has an energy gap with the range of from 0.82 eV to 1.12 eV.

2. The semiconductor laser as claimed in claim 1, wherein said buried current blocking layer comprises a bilayer structure provided on said semiconductor substrate, said bilayer structure comprising a lower semiconductor layer of the second conductivity type provided on said semiconductor substrate and an upper semiconductor layer of the first conductivity type provided on said lower semiconductor layer.

3. The semiconductor laser as claimed in claim 1, wherein said buried current blocking layer comprises a high resistive semiconductor layer.

4. The semiconductor laser as claimed in claim 3, wherein said high resistive semiconductor layer comprises a high resistive iron-doped InP layer.

5. The semiconductor laser as claimed in claim 1, wherein said first contact layer comprises an InGaAsP semiconductor layer having an energy gap within the range of from 0.82 eV to 1.12 eV,
   wherein said second contact layer is selected from the group consisting of an InGaAs semiconductor layer and an InGaAsP semiconductor layer which has an energy gap of 0.8 eV, and
   wherein said clad layer contacting said first contact layer comprises an InP layer.

6. The semiconductor laser as claimed in claim 1, wherein said contact layer further comprises a third contact layer comprising an InGaAsP semiconductor layer, said third contact layer intervening between said first and second contact layers, and wherein said first contact layer has an energy gap smaller than that of said clad layer and said third contact layer has an energy gap smaller than that of said first contact layer but greater than that of said second contact layer.

7. The semiconductor laser as claimed in claim 6, wherein said first contact layer comprises an InGaAsP semiconductor layer having an energy gap within the range of from 0.82 eV to 1.12 eV,
   wherein said second contact layer is selected from the group consisting of an InGaAs semiconductor layer and an InGaAsP semiconductor layer which has an energy gap of 0.8 eV, and
   wherein said clad layer contacting said first contact layer comprises an InP layer.

8. The semiconductor laser as claimed in claim 1, wherein said mesa stripe portion is vertical to a main surface of said semiconductor substrate.

9. A semiconductor laser comprising:
   (a) a semiconductor substrate of a first conductivity type;
   (b) a mesa stripe portion comprising a multilayer structure comprising an active layer, provided on said semiconductor substrate;
   (c) a buried current blocking layer arranged on both sides of said mesa stripe portion;
   (d) a clad layer of a second conductivity type provided over said semiconductor substrate through at least a portion of said active layer, said clad layer being provided on said active layer in said mesa stripe portion; and
   (e) a contact layer of the second conductivity type provided on said clad layer, said contact layer comprising a first contact layer contacting said clad layer and a second contact layer provided on said first contact layer, said first contact layer having an energy gap less than that of said clad layer and greater than that of said second contact layer, said first and second contact layers being provided on said clad layer in said mesa stripe portion;
   wherein said first contact layer comprises an InGaAsP semiconductor layer having an energy gap within the range of from 0.82 eV to 1.12 eV,
   wherein said second contact layer is selected from the group consisting of an InGaAs semiconductor layer and an InGaAsP semiconductor layer which has an energy gap of 0.8 eV, and
   wherein said clad layer contacting said first contact layer comprises an InP layer.

10. A semiconductor laser comprising:
    (a) a semiconductor substrate of a first conductivity type;
    (b) a mesa stripe portion comprising a multilayer structure comprising an active layer, provided on said semiconductor substrate;

(c) a buried current blocking layer arranged on both sides of said mesa stripe portion;

(d) a clad layer of a second conductivity type provided over said semiconductor substrate through at least a portion of said active layer, said clad layer being provided on said active layer in said mesa stripe portion; and (e) a contact layer of the second conductivity type provided on said clad layer, said contact layer comprising a first contact layer contacting said clad layer and a second contact layer provided on said first contact layer, said first contact layer having an energy gap less than that of said clad layer and greater than that of said second contact layer, said first and second contact layers being provided on said clad layer in said mesa stripe portion, and wherein said contact layer further comprises a third contact layer comprising an InGaAsP semiconductor layer, said third contact layer intervening between said first and second contact layers, and wherein said first contact layer has an energy gap less than that of said clad layer and said third contact layer has an energy gap less than that of said first contact layer and greater than that of said second contact layer.

11. The semiconductor laser as claimed in claim 10, wherein said first contact layer comprises an InGaAsP semiconductor layer having an energy gap within the range of from 0.82 eV to 1.12 eV, wherein said second contact layer is selected from the group consisting of an InGaAs semiconductor layer and an InGaAsP semiconductor layer which has an energy gap of 0.8 eV, and wherein said clad layer contacting said first contact layer comprises an InP layer.

12. A semiconductor laser comprising:

(a) a semiconductor substrate of a first conductivity type;

(b) a mesa stripe portion comprising a multilayer structure comprising an active layer, provided on said semiconductor substrate;

(c) a buried current blocking layer arranged on both sides of said mesa stripe portion;

(d) a clad layer of a second conductivity type provided over said semiconductor substrate through at least a portion of said active layer, said clad layer being provided on said active layer of said mesa stripe portion;

(e) a semiconductor layer of the second conductivity type provided on an upper portion of said mesa stripe portion and said buried current blocking layer;

(f) a contact layer of the second conductivity type provided on said semiconductor layer of the second conductivity type, said contact layer comprising a first contact layer contacting said semiconductor layer of the second conductivity type and a second contact layer provided on said first contact layer, said first contact layer having an energy gap less than that of said semiconductor layer of the second conductivity type and greater than that of said second contact layer; and wherein said first contact layer comprises an InGaAsP semiconductor layer having an energy gap substantially within the range of from 0.82 eV to 1.12 eV, wherein said second contact layer is selected from the group consisting of an InGaAs semiconductor layer and an InGaAsP semiconductor layer which has an energy gap of approximately 0.8 eV, and wherein said semiconductor layer comprises an InP layer.

13. A semiconductor laser comprising:

(a) a semiconductor substrate of a first conductivity type;

(b) a mesa stripe portion comprising a multilayer structure comprising an active layer, provided on said semiconductor substrate;

(c) a buried current blocking layer arranged on both sides of said mesa stripe portion;

(d) a clad layer of a second conductivity type provided over said semiconductor substrate through at least a portion of said active layer, said clad layer being provided on said active layer of said mesa stripe portion;

(e) a semiconductor layer of the second conductivity type provided on an upper portion of said mesa stripe portion and said buried current blocking layer;

(f) a contact layer of the second conductivity type provided on said semiconductor layer of the second conductivity type, said contact layer comprising a first contact layer contacting said semiconductor layer of the second conductivity type and a second contact layer provided on said first contact layer, said first contact layer having an energy gap less than that of said semiconductor layer of the second conductivity type and greater than that of said second contact layer; and wherein said contact layer further comprises a third contact layer having an InGaAsP semiconductor layer, said third contact layer intervening between said first and second contact layers, and wherein said third contact layer has an energy gap less than that of said first contact layer but greater than that of said second contact layer.

14. The semiconductor laser as claimed in claim 13, wherein said first contact layer comprises an InGaAsP semiconductor layer having an energy gap within the range of from 0.82 eV to 1.12 eV, wherein said second contact layer is selected from the group consisting of an InGaAs semiconductor layer and an InGaAsP semiconductor layer which has an energy gap of 0.8 eV, and wherein said clad layer contacting said first contact layer comprises an InP layer.

* * * * *